(12) United States Patent
Takemura et al.

(10) Patent No.: US 11,329,179 B2
(45) Date of Patent: May 10, 2022

(54) SEMICONDUCTOR LIGHT-RECEIVING DEVICE AND METHOD FOR MANUFACTURING THE SAME

(71) Applicant: Mitsubishi Electric Corporation, Tokyo (JP)

(72) Inventors: Ryota Takemura, Tokyo (JP); Eitaro Ishimura, Tokyo (JP); Harunaka Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 255 days.

(21) Appl. No.: 16/625,974

(22) PCT Filed: Sep. 15, 2017

(86) PCT No.: PCT/JP2017/033446
§ 371 (c)(1),
(2) Date: Dec. 23, 2019

(87) PCT Pub. No.: WO2019/053877
PCT Pub. Date: Mar. 21, 2019

(65) Prior Publication Data
US 2020/0203544 A1 Jun. 25, 2020

(51) Int. Cl.
*H01L 31/054* (2014.01)
*H01L 31/0224* (2006.01)
*H01L 31/05* (2014.01)

(52) U.S. Cl.
CPC .... *H01L 31/054* (2014.12); *H01L 31/022483* (2013.01); *H01L 31/05* (2013.01)

(58) Field of Classification Search
None
See application file for complete search history.

(56) References Cited

U.S. PATENT DOCUMENTS 6,229,162 B1 5/2001 Watanabe
2007/0096236 A1* 5/2007 Yagyu ............... H01L 31/107
257/438

FOREIGN PATENT DOCUMENTS

JP H11330530 A 11/1999
JP 2008021725 A 1/2008

OTHER PUBLICATIONS

International Search Report issued in PCT/JP2017/033446; dated Nov. 14, 2017.

* cited by examiner

*Primary Examiner* — Evren Seven
(74) *Attorney, Agent, or Firm* — Studebaker & Brackett PC (57) ABSTRACT

A multiplication layer on a semiconductor substrate of n-type contains Al atoms. An electric field control layer on the multiplication layer is of p-type, and includes a high-concentration area, and a low-concentration area lower in impurity concentration than the high-concentration area which is formed outside the high-concentration area. An optical absorption layer on the electric field control layer is lower in impurity concentration than the high-concentration area. A window layer of n-type formed on the optical absorption layer is larger in band gap than the optical absorption layer. A light-receiving area of p-type is formed apart from an outer edge of the window layer, and at least partly faces the high-concentration area through the window layer and the optical absorption layer. The guard ring area of p-type which the window layer separates from the light-receiving area penetrates through the window layer to extend into the optical absorption layer.

7 Claims, 10 Drawing Sheets

SEMICONDUCTOR LIGHT-RECEIVING DEVICE AND METHOD FOR MANUFACTURING THE SAME

TECHNICAL FIELD

The present invention relates to a semiconductor light-receiving device and a method for manufacturing the same, and particularly to a semiconductor light-receiving device including a guard ring area and a method for manufacturing the same.

BACKGROUND ART

Avalanche photodiodes (APD) containing InP as a material of multiplication layers are widely used as semiconductor light-receiving devices to be used in, for example, optical fiber communications. The APDs including InP multiplication layers amplify carriers generated from incident light by multiplying holes to increase the SN ratios as receivers. In other words, the APDs including InP multiplication layers are classified as the hole multiplication type.

As described in, for example, Japanese Unexamined Patent Application Publication No. 2008-21725 (Patent Document 1), a guard ring is generally formed around a light-receiving area in an APD including an InP multiplication layer. An object of forming a guard ring is to prevent an edge breakdown caused by a sudden multiplication in an edge of a light-receiving area. Another object is to prevent a breakdown caused by concentration of a current to a light receiver, using a guard ring as a current path by bringing a reach-through state, which is generated upon an instant increase in an input light, to the guard ring earlier than to the center of a light-receiving area. Here, the APD structure consists not only of the original light-receiving area but also of the guard ring. When APD structures having different reach-through states are arranged in parallel, a current flows through the APD structure with a lower reach-through voltage generally earlier. The APD structure with a higher breakdown voltage can tolerate a higher voltage. Thus, the guard ring with intended functions needs to be higher in breakdown voltage than the light-receiving area and lower in reach-through voltage than the light receiver.

In recent years, Al-based multiplication layers made of materials containing Al atoms such as AlInAs have been used as the multiplication layers of the APDs. The APDs including the Al-based multiplication layers, which are classified as electron multiplication type, expectedly perform operations with higher speed and lower noise than the APDs of the hole multiplication type. The bit rate required for semiconductor light-receiving devices is increasing. The APDs of the electron multiplication type are widely used to support this. In general, an n-type substrate is often used in the APD for optical communication. Here, an Al-based multiplication layer, an optical absorption layer, and a window layer are laminated in this order on the substrate. Thus, in this Al-based APD, the multiplication layer is disposed between the substrate and the optical absorption layer. In other words, the multiplication layer is disposed deeper on the substrate in a layered structure. Such Al-based APDs have different arrangements from those of InP-based APDs. Thus, the difficulty lies in applying the technology for forming guard rings in the InP-based APDs to the Al-based APDs as it is.

Japanese Unexamined Patent Application Publication No. H11-330530 discloses an Al-based APD with a structure conceived in view of problems when a guard ring is introduced. This structure provides a field relaxing layer including a portion partly with a low concentration, with consideration given to constraint of the electric field concentration.

PRIOR ART DOCUMENT

Patent Document

[Patent Document 1] Japanese Unexamined Patent Application Publication No. 2008-21725
[Patent Document 2] Japanese Unexamined Patent Application Publication No. H11-330530

SUMMARY

Problem to be Solved by the Invention

As described above, a method for applying a guard ring structure to an APD including a multiplication layer containing Al atoms has not been fully studied.

The present invention has been conceived to solve the problem, and has an object of providing a semiconductor light-receiving device and a method for manufacturing the same so that a guard ring structure can effectively be incorporated into the APD including the multiplication layer containing Al atoms.

Means to Solve the Problem

A semiconductor light-receiving device according to the present invention includes a semiconductor substrate, a multiplication layer, an electric field control layer, an optical absorption layer, a window layer, a light-receiving area, and a guard ring area. The semiconductor substrate is of n-type. The multiplication layer is formed on the semiconductor substrate, and contains Al atoms. The electric field control layer of p-type is formed on the multiplication layer. The electric field control layer includes a high-concentration area higher in impurity concentration than the multiplication layer, and a low-concentration area lower in impurity concentration than the high-concentration area, the low-concentration area being formed outside the high-concentration area. The optical absorption layer is formed on the electric field control layer, and is lower in impurity concentration than the high-concentration area of the electric field control layer. The window layer of n-type is formed on the optical absorption layer, is larger in band gap than the optical absorption layer, and includes an outer edge. The light-receiving area of p-type is formed on the window layer apart from the outer edge of the window layer, and at least partly faces the high-concentration area of the electric field control layer through the window layer and the optical absorption layer in a thickness direction. The guard ring area of p-type which the window layer separates from the light-receiving area penetrates through the window layer to extend into the optical absorption layer.

A method for manufacturing a semiconductor light-receiving device according to the present invention is the method for manufacturing the semiconductor light-receiving device including a semiconductor substrate, a multiplication layer, an electric field control layer, an optical absorption layer, a window layer, a light-receiving area, and a guard ring area. The semiconductor substrate is of n-type. The multiplication layer is formed on the semiconductor substrate, and contains Al atoms. The electric field control layer of p-type is formed on the multiplication layer. The electric field control layer includes a high-concentration area higher in impurity concentration than the multiplication layer, and a low-concentration area lower in impurity concentration than the high-concentration area, the low-concentration area being formed outside the high-concentration area. The optical absorption layer is formed on the electric field control layer, and is lower in impurity concentration than the high-concentration area of the electric field control layer. The window layer of n-type is formed on the optical absorption layer, is larger in band gap than the optical absorption layer, and includes an outer edge. The light-receiving area of p-type is formed on the window layer apart from the outer edge of the window layer, and at least partly faces the high-concentration area of the electric field control layer through the window layer and the optical absorption layer in a thickness direction. The guard ring area of p-type which the window layer separates from the light-receiving area penetrates through the window layer to extend into the optical absorption layer. The method for manufacturing the semiconductor light-receiving device comprises the following steps. A semiconductor layer of p-type is formed with Be atoms contained, the semiconductor layer including a first area corresponding to the high-concentration area of the electric field control layer, and a second area to be the low-concentration area of the electric field control layer. The optical absorption layer is formed on the semiconductor layer. The window layer is formed on the optical absorption layer. A mask with an opening portion is formed on the window layer. Zn atoms are diffused from the opening portion of the mask. In the step of diffusing the Zn atoms, the guard ring area of p-type is formed with the Zn atoms contained, and the electric field control layer is formed from the semiconductor layer by reducing a concentration of Be atoms in the second area of the semiconductor layer more than a concentration of Be atoms in the first area of the semiconductor layer.

Effects of the Invention

The present invention provides an electric field control layer including a high-concentration area and a low-concentration area, and a guard ring area penetrating through a window layer to extend into an optical absorption layer. These can effectively provide the guard ring structure.

The object, features, aspects and advantages of the present invention will become more apparent from the following detailed description and the accompanying drawings.

DESCRIPTION OF EMBODIMENTS

Embodiments of the present invention will be hereinafter described with reference to the drawings. The same reference numerals are assigned to the same or equivalent portions in the drawings, and the description is not repeated.

Embodiment 1

(Brief description of a structure)

Figure 1:
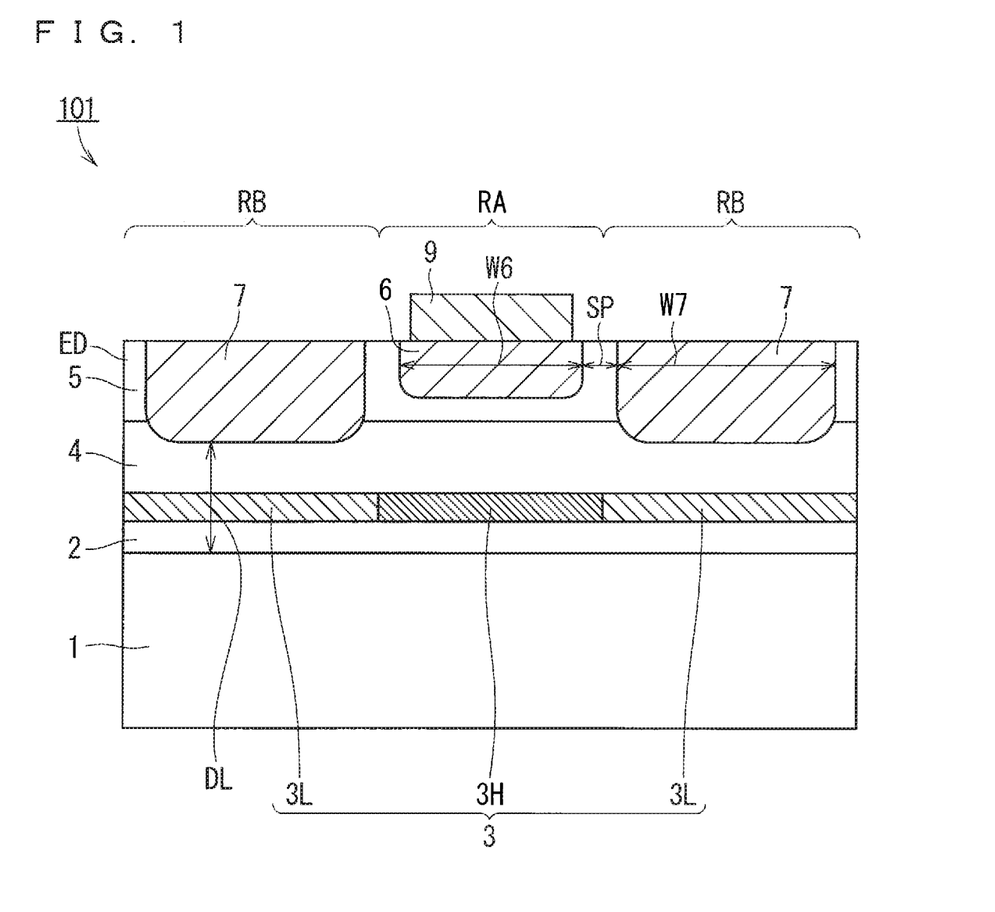
FIG. 1 is a cross-sectional view schematically illustrating a structure of a semiconductor light-receiving device according to Embodiment 1 of the present invention.

FIG. 1 is a cross-sectional view schematically illustrating a structure of an APD 101 (a semiconductor light-receiving device) according to Embodiment 1. The APD 101 includes a light receiver RA and an outer periphery RB disposed around the light receiver RA (left and right portions in FIG. 1). The APD 101 includes a semiconductor substrate 1, a multiplication layer 2, an electric field control layer 3, an optical absorption layer 4, a window layer 5, a light-receiving area 6, a guard ring area 7, an anode electrode 9, and a cathode electrode (not shown). At least one of a side surface and an upper surface of the APD 101 may be covered with a passivation film made of, for example, SiN.

The semiconductor substrate 1 is placed across the light receiver RA and the outer periphery RB. The semiconductor substrate 1 is of n-type. The semiconductor substrate 1 is, for example, an InP substrate.

The multiplication layer 2 is placed across the light receiver RA and the outer periphery RB, and is formed on the semiconductor substrate 1. The multiplication layer 2 may be an epitaxial layer formed on the semiconductor substrate 1. The multiplication layer 2 is made of a semiconductor, and contains at least Al atoms. In other words, the multiplication layer 2 is an Al-based multiplication layer. The multiplication layer 2 is, for example, an AlInAs layer. The multiplication layer 2 can effectively multiply electrons by containing the Al atoms. Preferably, the multiplication layer 2 is lower in impurity concentration than the semiconductor substrate 1.

The electric field control layer 3 is placed across the light receiver RA and the outer periphery RB, and is formed on the multiplication layer 2. The electric field control layer 3 may be an epitaxial layer formed on the multiplication layer 2. The electric field control layer 3 is of p-type. The electric field control layer 3 includes a high-concentration area 3H included in the light receiver RA, and a low-concentration area 3L included in the outer periphery RB. Thus, the low-concentration area 3L is formed outside the high-concentration area 3H (to the right and left in FIG. 1) in the surface direction (the horizontal direction in FIG. 1). The high-concentration area 3H is higher in impurity concentration than the multiplication layer 2. The low-concentration area 3L is lower in impurity concentration than the high-concentration area 3H. The electric field control layer 3 is made of, for example, InP or AlInAs.

The optical absorption layer 4 is placed across the light receiver RA and the outer periphery RB, and is formed on the electric field control layer 3. The optical absorption layer 4 may be an epitaxial layer formed on the electric field control layer 3. The optical absorption layer 4 is made of a semiconductor, and is lower in impurity concentration than the high-concentration area 3H of the electric field control layer 3. Preferably, the optical absorption layer 4 is lower in impurity concentration than the semiconductor substrate 1. The optical absorption layer 4 is made of a material with a band gap smaller than the energy of an incident light detected by the APD 101. The detected incident light has a wavelength, for example, ranging from 1270 nm to 1610 nm. The material of the optical absorption layer 4 is selected from, for example, InGaAs and InGaAsP. The band gap of the optical absorption layer 4 made of, for example, InGaAs can amount to an energy value equivalent to a wavelength of approximately 1670 nm.

The window layer 5 is formed on the optical absorption layer 4. The window layer 5 may be an epitaxial layer formed on the optical absorption layer 4. The window layer 5 is at least included in the light receiver RA, and is placed across the light receiver RA and the outer periphery RB in the structure of FIG. 1. The window layer 5 includes an outer edge ED which corresponds to the circumferential edge (left and right edges in FIG. 1) of the outer periphery RB in the structure of FIG. 1. The window layer 5 is of n-type. Preferably, the window layer 5 is lower in impurity concentration than the semiconductor substrate 1. The window layer 5 is made of a material larger in band gap than the optical absorption layer 4. The material of the window layer 5 is selected from among, for example, InP, AlInAs, AlGaInAs, and InGaAsP. The band gap of the window layer 5 made of, for example, InP can amount to an energy value equivalent to a wavelength of approximately 900 nm.

A relaxing layer for relaxing the band discontinuity may be disposed at least between the optical absorption layer 4 and the electric field control layer 3 or between the optical absorption layer 4 and the window layer 5. This relaxing layer is made of, for example. InGaAsP or AlGaInAs.

The light-receiving area 6 is of p-type. Preferably, the light-receiving area 6 is higher in impurity concentration than the window layer 5. The light-receiving area 6 is included in the light receiver RA, and is formed on the window layer 5 apart from the outer edge ED of the window layer 5. The light-receiving area 6 at least partly faces the high-concentration area 3H of the electric field control layer 3 through the window layer 5 and the optical absorption layer 4 in a thickness direction. In the structure of FIG. 1, the light-receiving area 6 fully faces the high-concentration area 3H. The light-receiving area 6 may be formed by thermally diffusing acceptors partly on the surface of the window layer 5.

The guard ring area 7 is of p-type. Preferably, the guard ring area 7 is higher in impurity concentration than the window layer 5. Preferably, the guard ring area 7 is higher in impurity concentration than the optical absorption layer 4. The window layer 5 separates the guard ring area 7 from the light-receiving area 6 in the surface direction (the horizontal direction in FIG. 1). The guard ring area 7 penetrates through the window layer 5 in the thickness direction (a vertical direction in FIG. 1) to extend into the optical absorption layer 4. In other words, the bottom portion of the guard ring area 7 is deeper than the lower surface of the window layer 5, deeper than the upper surface of the optical absorption layer 4, and shallower than the lower surface of the optical absorption layer 4. Thus, the guard ring area 7 at least partly faces the low-concentration area 3L of the electric field control layer 3 through the optical absorption layer 4 in the thickness direction. In the structure of FIG. 1, the guard ring area 7 fully faces the low-concentration area 3L. The guard ring area 7 may be formed by thermally diffusing the acceptors from a part of the surface of the window layer 5 to penetrate through the window layer 5 into the optical absorption layer 4.

In a planar layout, the light-receiving area 6 is circular, and the guard ring area 7 is ring-shaped to surround this circle as a typical example. In this example, a width W6 is a diameter of the circle, and a width W7 is a dimension between the outer edge and inner edge of the ring in FIG. 1.

The anode electrode 9 is typically made of a metal. The anode electrode 9 is formed on the light-receiving area 6 apart from the window layer 5. In the structure of FIG. 1, light is presumed to be incident from the rear surface (the lower surface in FIG. 1) of the semiconductor substrate 1 to the APD 101. Thus, the anode electrode 9 made of the metal may cover the large portion of the light-receiving area 6 on the top surface (the upper surface in FIG. 1) of the semiconductor substrate 1. The cathode electrode (not shown) is typically made of a metal. The cathode electrode should be disposed in contact with the semiconductor substrate 1. The cathode electrode may be disposed on, for example, the rear surface of the semiconductor substrate 1. Alternatively, the cathode electrode may be, for example, in contact with the semiconductor substrate 1 from the top surface (the upper surface in FIG. 1) side thereof. Here, the constituent elements other than the semiconductor substrate 1 may have openings to prevent the cathode electrode from being unnecessarily in contact with these constituent elements. An area made of, for example, AlGaInAs, InGaAsP, or InGaAs may be disposed between the light-receiving area 6 and the anode electrode 9 to reduce contact resistance.

The material of each of the constituent elements of the APD 101 may be any with characteristics necessary for implementing the functions of the element, and is not limited by the materials specifically described above.

(Results of simulations on the breakdown voltage and the reach-through voltage)

Figure 2:
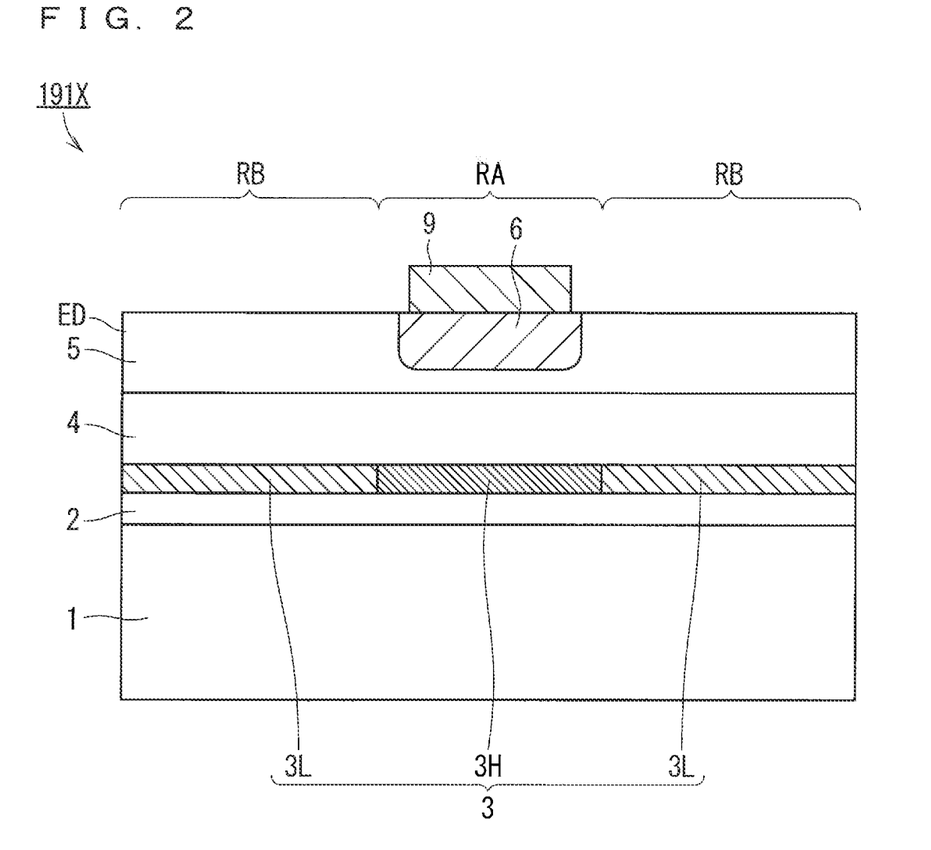
FIG. 2 is a cross-sectional view illustrating a structure of a semiconductor light-receiving device in a reference X.
Figure 3:
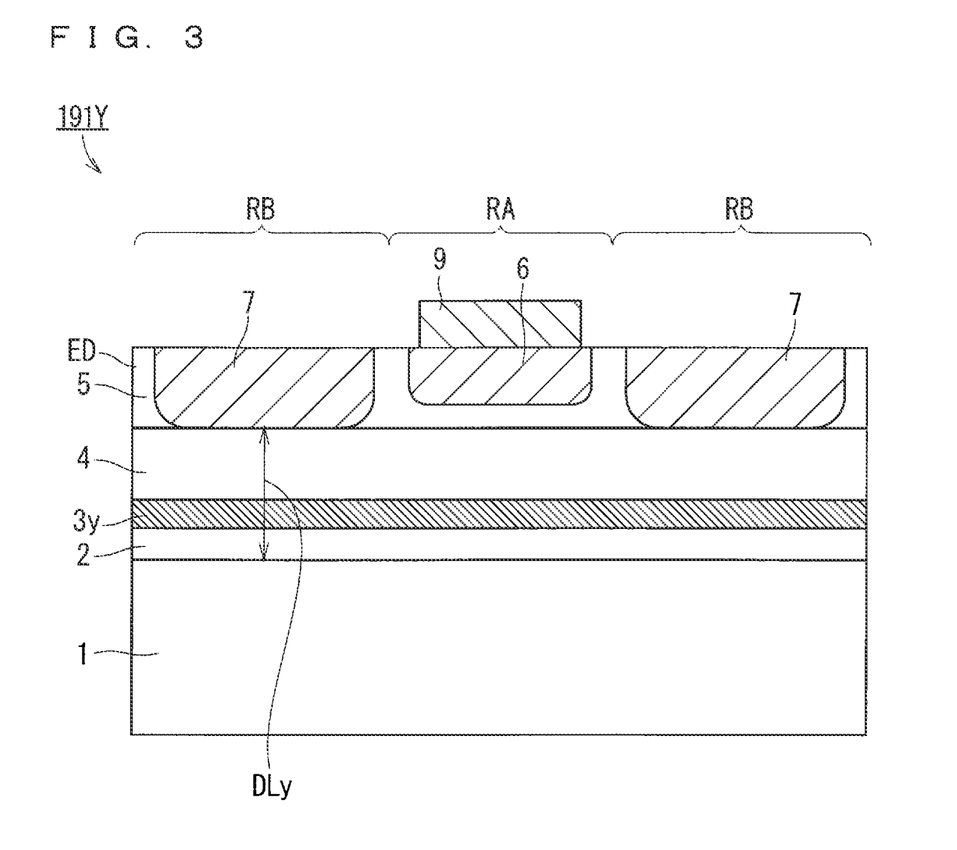
FIG. 3 is a cross-sectional view illustrating a structure of a semiconductor light-receiving device in a reference Y.

The breakdown voltage and the reach-through voltage are studied in simulation, based on the APD 101 (FIG. 1) according to Embodiment 1, an APD 191X (FIG. 2) in a reference X, and an APD 191Y (FIG. 3) in a reference Y. The APD 191X (FIG. 2) does not include the guard ring area 7, unlike the APD 101 (FIG. 1). The guard ring area 7 of the APD 191Y (FIG. 3), which is formed shallower than the guard ring area of the APD 101 (FIG. 1), extends to the boundary between the window layer 5 and the optical absorption layer 4 in the thickness direction but does not extend into the optical absorption layer 4. Thus, a thickness range DLy in which a depletion layer may be formed in the APD 191Y (FIG. 3) is greater than a thickness range DL in which a depletion layer may be formed in the APD 101 (FIG. 1). The APD 191Y includes an electric field control layer 3y as a replacement for the electric field control layer 3 (FIG. 1). The electric field control layer 3y has, in the surface direction, uniform impurity concentrations as high as that of the high-concentration area 3H of the electric field control layer 3. The results of the simulations will be described below.

TABLE 1

|  | BREAKDOWN VOLTAGE [V] | REACH-THROUGH VOLTAGE [V] |
|---|---|---|
| LIGHT RECEIVER | 32.58 | 14.05 |
| OUTER PERIPHERY OF REFERENCE X | 36.27 | 8.45 |
| OUTER PERIPHERY OF REFERENCE Y | 28.47 | 12.44 |
| OUTER PERIPHERY OF EMBODIMENT 1 | 32.84 | 7.36 |

In the table above, the row of "LIGHT RECEIVER" shows results of the simulations on the light receivers RA in the drawings. The structure of the light receivers is common among the three examples. In the table above, the rows of "OUTER PERIPHERY" show results of the simulations on the outer peripheries RB in the drawings. Since the structures of the outer peripheries RB are different among the three examples, different values are calculated. In the table above, the "REACH-THROUGH VOLTAGE" is a voltage required for the depletion layer to extend from the semiconductor substrate 1 to the window layer 5 or the window layer 5 including the guard ring area 7.

Figure 4:
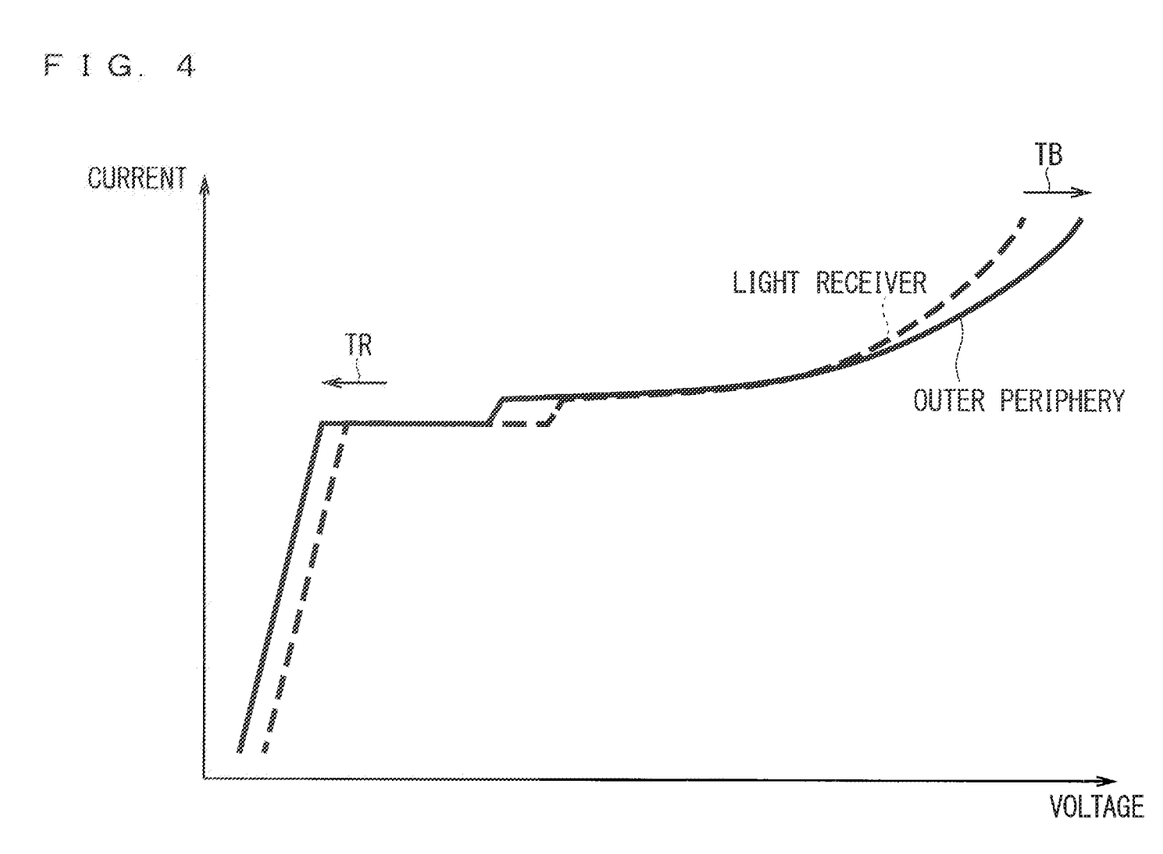
FIG. 4 is a graph illustrating a preferable relationship between voltage-current characteristics in a light receiver and voltage-current characteristics in an outer periphery.

FIG. 4 is a graph illustrating a preferable relationship between voltage-current characteristics in the light receiver and voltage-current characteristics in the outer periphery. The breakdown voltage of the outer periphery needs to be higher than or equal to the breakdown voltage of the light receiver (see the arrow TB in FIG. 4) to avoid further reduction in the breakdown voltage of the APD due to the provision of the outer periphery. Under this condition, the reach-through voltage of the outer periphery is preferably lower than the reach-through voltage of the light receiver (see the arrow TR in FIG. 4) to constrain the current concentration on the light receiver. In this respect, the study of the results shown in the table concludes that the structure according to Embodiment 1 is the best in comparison with the references X and Y. The reach-through voltage of the outer periphery in the reference X, which is lower than the reach-through voltage of the light receiver, is higher than the reach-through voltage according to Embodiment 1. Thus, there is some room for improvement in this point. The outer periphery in the reference Y (FIG. 3) is in a state opposite to the preferable state described with reference to FIG. 4, This means that the guard ring area 7 in the reference Y does not have the intended functions. In contrast, the results show that the guard ring area 7 according to Embodiment 1 has the intended functions.

As described above, the APD 101 according to Embodiment 1 can be effectively provided with a guard ring structure by including: the electric field control layer 3 including the high-concentration area 3H and the low-concentration area 3L; and the guard ring area 7 that penetrates through the window layer 5 to extend into the optical absorption layer 4.

(Details of the structure)

It is preferred that the guard ring area 7 (FIG. 1) contains Zn atoms and the electric field control layer 3 (FIG. 1) contains Be atoms as the acceptors. It is preferred that the guard ring area 7 does not substantially contain any Be atom and the electric field control layer 3 does not substantially contain any Zn atom. The Zn atoms have characteristics prone to diffusion, whereas the Be atoms have characteristics less prone to diffusion. Thus, application of different acceptor atoms can make easier a step of adding acceptors to a desired area in manufacturing the APD 101.

A distance SP (FIG. 1) between the light-receiving area 6 and the guard ring area 7 is preferably longer than or equal to 3 μm. In other words, the guard ring area 7 is preferably distant from the light-receiving area 6 by 3 μm or longer. When an operating voltage is applied, if the distance SP is too small, the depletion layer extending from the light-receiving area 6 reaches the guard ring area 7, so that the capacity increases. This makes it difficult to operate the APD at high speeds. The window layer 5 generally has a carrier concentration of $1 \times 10^{16}$ cm$^{-3}$ or less. The depletion layer extends approximately 2 μm farther with application of the operating voltage to the APD. As described above, when the distance SP is longer than or equal to 3 the depletion layer extending from the light-receiving area 6 can avoid reaching the guard ring area 7.

The guard ring area 7 preferably has a carrier concentration of $1 \times 10^{18}$ cm$^{-3}$ or more as a peak value. When the guard ring area 7 is formed with carrier concentration which is not sufficiently higher than that of the optical absorption layer 4, only a small amount of dopant is added, so that the depth of the guard ring area 7 to be formed tends to be instable. As a result, the precision of the thickness DL (FIG. 1) of the depletion layer to be formed below the guard ring area 7 decreases. Thus, optimizing the breakdown voltage and the reach-through voltage in the outer periphery RB is difficult. Since the optical absorption layer 4 generally has the carrier concentration of $1 \times 10^{16}$ cm$^{-3}$ or less, the guard ring area 7 with the carrier concentration of $1 \times 10^{18}$ cm$^{-3}$ or more as described above can sufficiently ensure the precision of the thickness DL. The light-receiving area 6 may have a carrier concentration as high as that of the guard ring area 7.

In a cross-section illustrating the maximum dimension of the light-receiving area 6 (for example, FIG. 1), the guard ring area 7 preferably has the width W7 greater than the width W6 of the light-receiving area 6. Generally, when a p-type area is formed by thermally diffusing dopants as acceptors using a mask with an opening portion, the wider the opening portion is, the wider and the deeper the formed p-type area is. Thus, when the width W7 is greater than the width. W6, thermal diffusion of the dopants using the mask having both the opening portion for forming the light-receiving area 6 and the opening portion for forming the guard ring area 7 can form the light-receiving area 6 and the guard ring area 7 at a time. When the light-receiving area 6 is circular in a planar layout, the cross-section described above exposes the diameter of this circle, which corresponds to the width W6.

(Modification)

Figure 5:
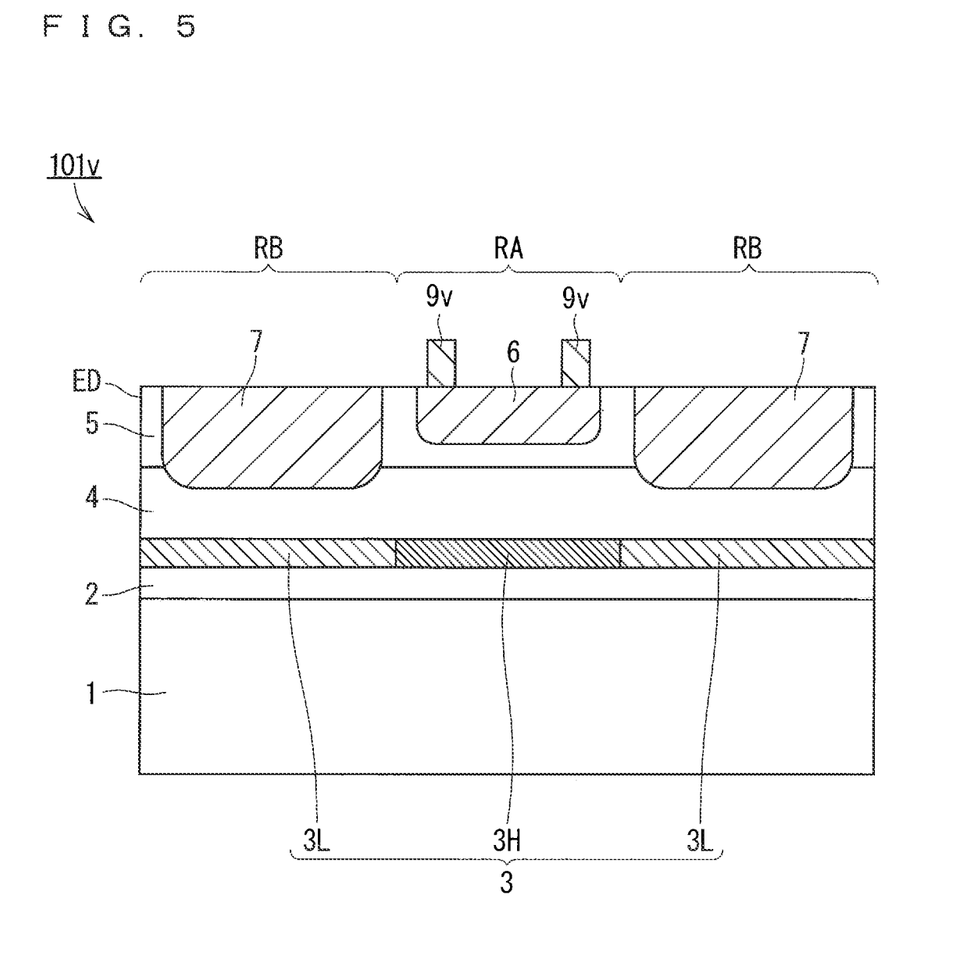
FIG. 5 is a cross-sectional view illustrating a modified example of FIG. 1.

FIG. 5 is a cross-sectional view illustrating a structure of an APD 101v (a semiconductor light-receiving device) as a modified example of the APD 101 (FIG. 1). In the structure of FIG. 5, light is presumed to be incident from the top surface (the upper surface in FIG. 5) of the semiconductor substrate 1 to the APD 101v. Thus, the APD 101v includes an anode electrode 9v as a replacement for the anode electrode 9. The anode electrode 9v merely covers a small proportion of the light-receiving area 6 on the top surface of the semiconductor substrate 1 (for example, a proportion less than a half the light-receiving area 6). This allows the light to be efficiently incident from the top surface of the semiconductor substrate 1 to the APD 101v.

Embodiment 2

Figure 6:
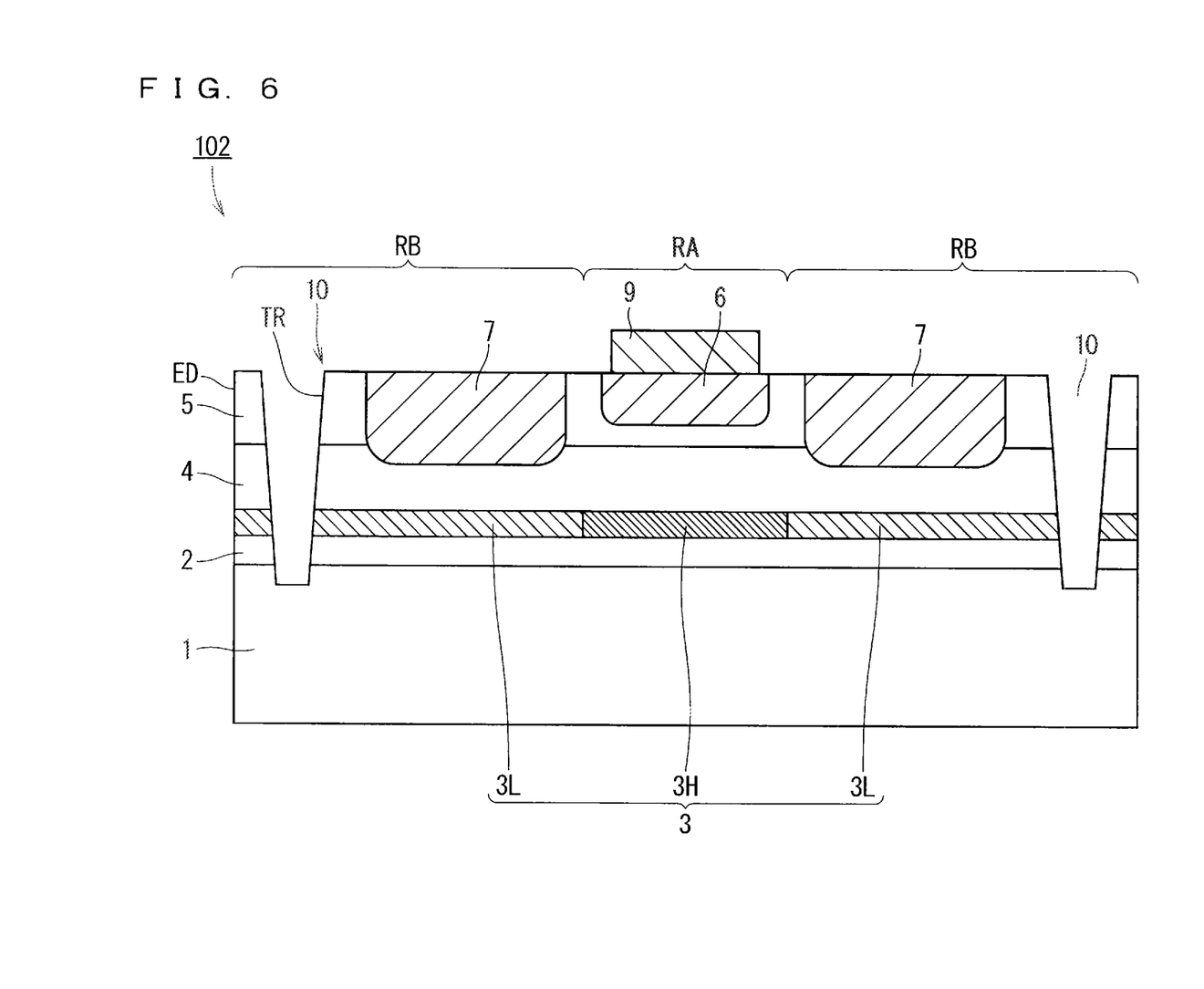
FIG. 6 is a cross-sectional view schematically illustrating a structure of a semiconductor light-receiving device according to Embodiment 2 of the present invention.

FIG. 6 is a cross-sectional view schematically illustrating a structure of an APD 102 (a semiconductor light-receiving device) according to Embodiment 2. In the APD 102, a mesa area 10 including the multiplication layer 2, the electric field control layer 3, the optical absorption layer 4, the light-receiving area 6, and the guard ring area 7 is formed on the semiconductor substrate 1. In the example of FIG. 6, to form the mesa area, a trench TR tapered in a depth direction (downward in FIG. 6) is formed outside the guard ring area 7 in the surface direction (the horizontal direction in FIG. 6). The window layer 5 separates the sidewall of the trench TR from the guard ring area 7. The trench TR penetrates through the window layer 5, the optical absorption layer 4, the electric field control layer 3, and the multiplication layer 2 from the surface (the upper surface in FIG. 6) of the window layer 5 to extend into the semiconductor substrate 1. The trench TR may be formed through etching using an etching mask.

Since the constituent elements other than the described elements are almost identical to those according to Embodiment 1, the same reference numerals are assigned to the same or corresponding elements, and the description thereof is not repeated.

According to Embodiment 2, provision of the mesa area 10 can constrain the leakage current that flows through the outside of the APD and causes the dark current. With application of a voltage lower than or equal to the reach-through voltage, the APD 102 including the mesa area 10 is under a state where the leakage current flows through a current path along the sidewall of the mesa area 10. Then, when a voltage exceeding the reach-through voltage is applied upon incidence of the light on the APD 102, the current path is instantly switched so that the current easily flows through the light receiver RA. According to Embodiment 2, the concentration of the current in such a circumstance can be effectively reduced for the reasons described in Embodiment 1.

Embodiment 3

Figure 7:
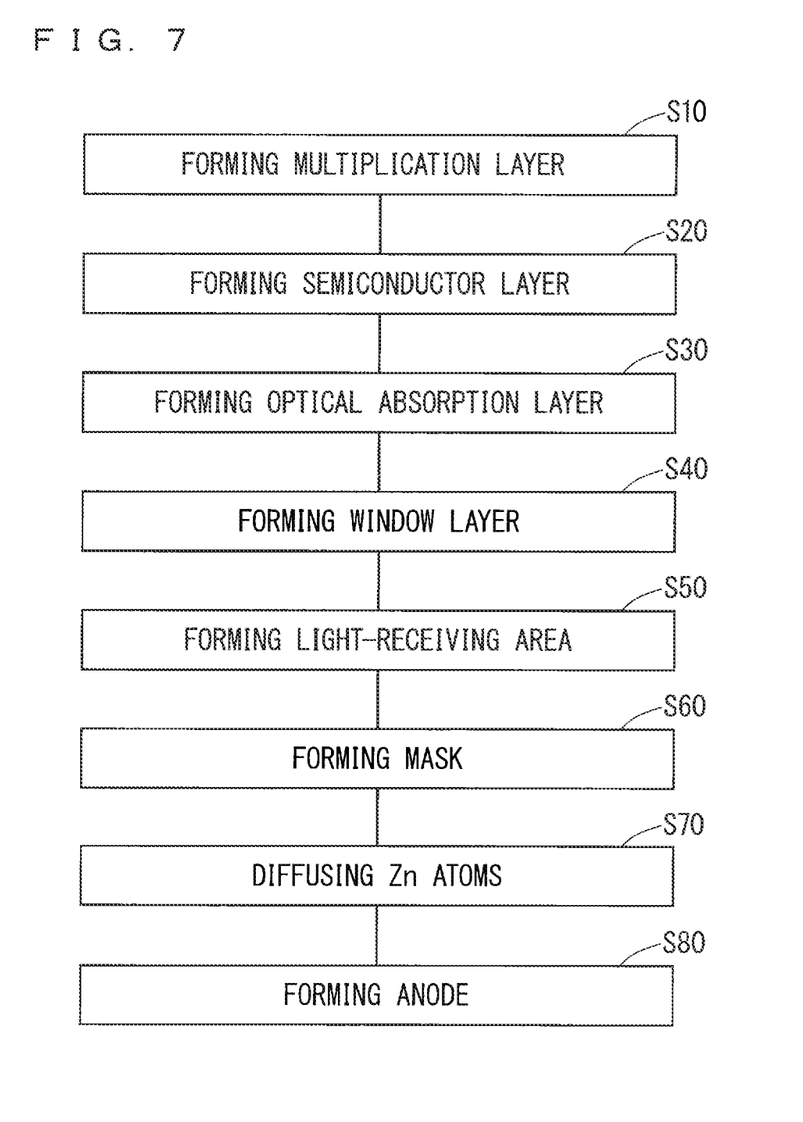
FIG. 7 is a flow chart schematically illustrating a method for manufacturing a semiconductor light-receiving device according to Embodiment 3 of the present invention.

Embodiment 3 will describe a manufacturing method appropriate for the APD 101 (FIG. 1: Embodiment 1). FIG. 7 is a flow chart schematically illustrating a method for manufacturing the APD 101 according to Embodiment 3. FIGS. 8 to 11 are cross-sectional views schematically illustrating the first to fourth steps in the manufacturing method.

Figure 8:
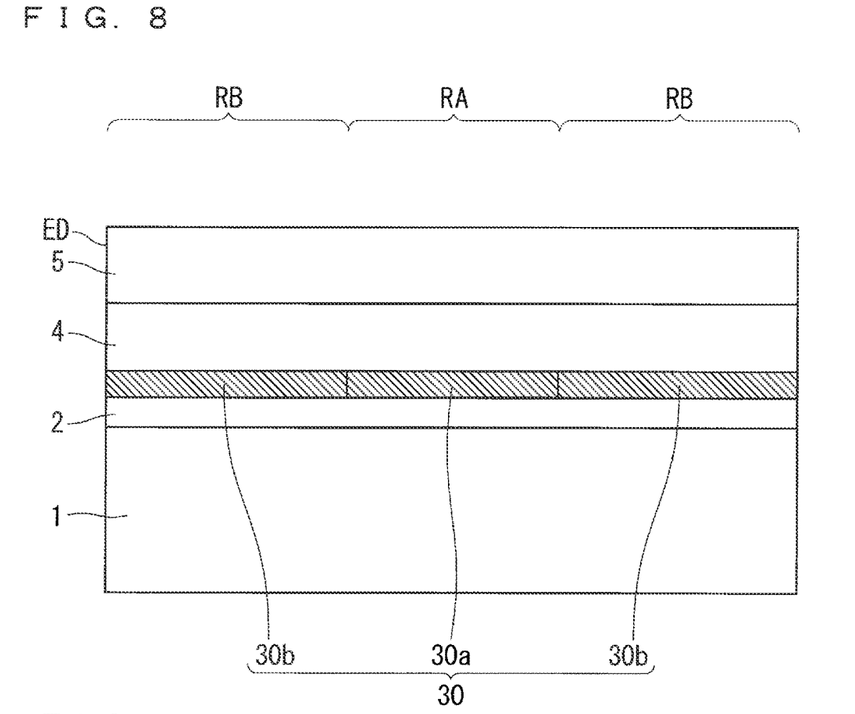
FIG. 8 is a cross-sectional view schematically illustrating the first step in the method for manufacturing the semiconductor light-receiving device according to Embodiment 3 of the present invention.

With reference to FIG. 8, the multiplication layer 2 is formed on the semiconductor substrate 1 by epitaxial growth in Step S10 (FIG. 7). Next, a semiconductor layer 30 is formed on the multiplication layer 2 by epitaxial growth in Step S20 (FIG. 7). The semiconductor layer 30 containing Be atoms is of p-type. The semiconductor layer 30 includes a first area 30a corresponding to the high-concentration area 3H (FIG. 1), and a second area 30b to be the low-concentration area 3L (FIG. 1). The semiconductor layer 30 has substantially uniform impurity concentrations in the surface direction (the horizontal direction in FIG. 8). Thus, the boundary line between the first area 30a and the second area 30b in FIG. 8 does not mean a boundary between areas with different physical properties but corresponds to a boundary between the high-concentration area 3H and the low-concentration area 3L to be formed in the subsequent steps. Next, the optical absorption layer 4 is formed on the semiconductor layer 30 by epitaxial growth in Step S30 (FIG. 7). Next, the window layer 5 is formed on the optical absorption layer 4 by epitaxial growth in Step S40 (FIG. 7).

Figure 9:
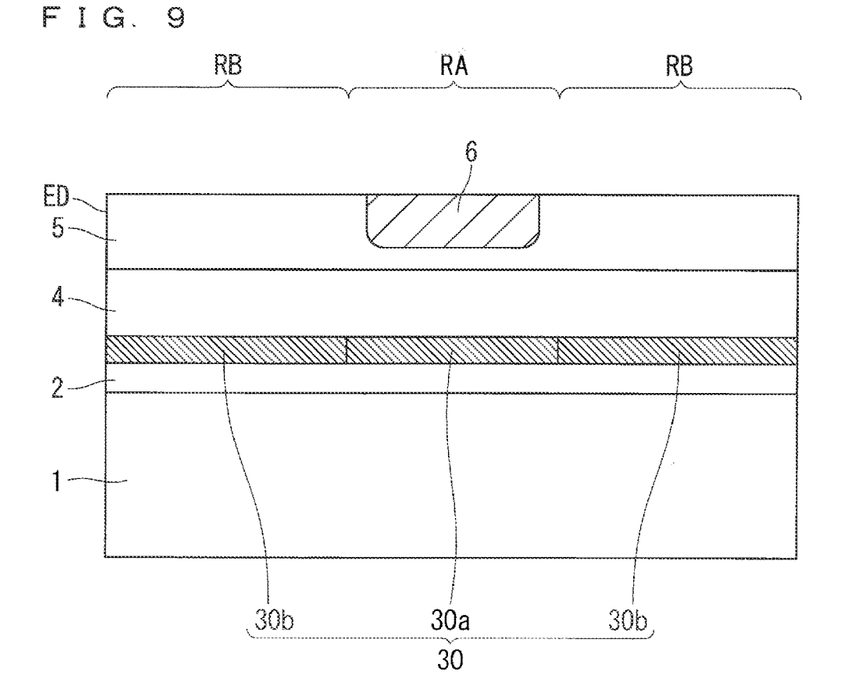
FIG. 9 is a cross-sectional view schematically illustrating the second step in the method for manufacturing the semiconductor light-receiving device according to Embodiment 3 of the present invention.

With reference to FIG. 9, the light-receiving area 6 is formed by thermally diffusing dopants as acceptors using a mask (not shown) with an opening portion in Step S50 (FIG. 7).

Figure 10:
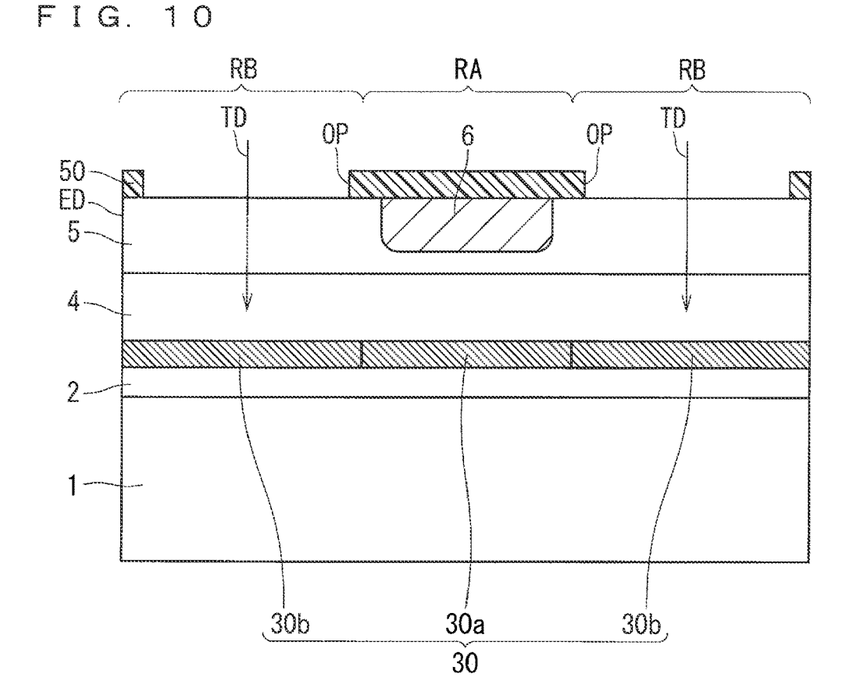
FIG. 10 is a cross-sectional view schematically illustrating the third step in the method for manufacturing the semiconductor light-receiving device according to Embodiment 3 of the present invention.

With reference to FIG. 10, a mask 50 with an opening portion OP is formed on the window layer 5 in Step S60 (FIG. 7). In Step S70 (FIG. 7), Zn atoms are thermally diffused from the opening portion OP as indicated by arrows TD.

Figure 11:
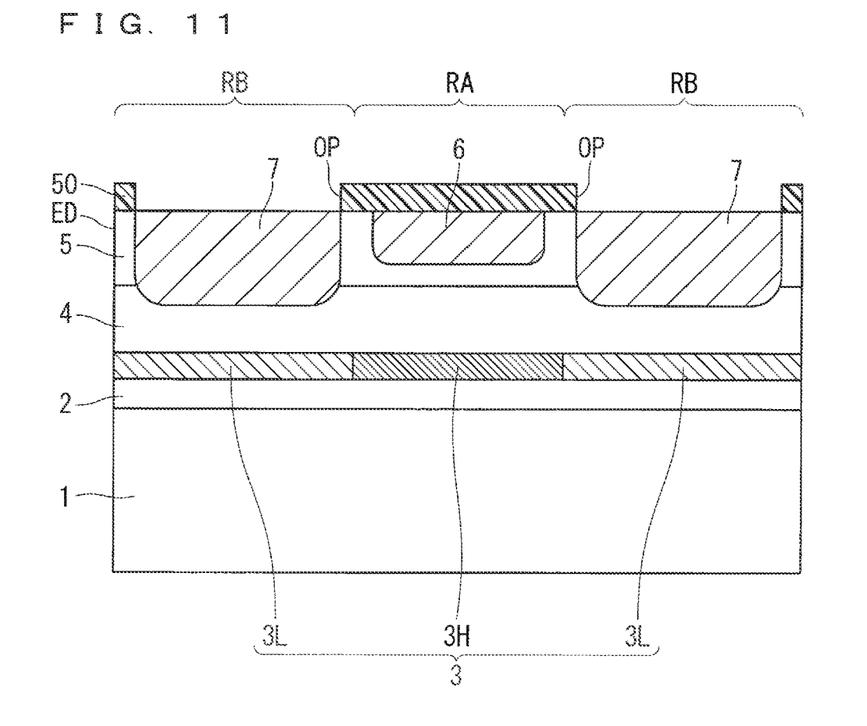
FIG. 11 is a cross-sectional view schematically illustrating the fourth step in the method for manufacturing the semiconductor light-receiving device according to Embodiment 3 of the present invention.

Further with reference to FIG. 11, the guard ring area 7 of p-type is formed with the Zn atoms contained in the above-mentioned step of thermally diffusing the Zn atoms. Further, the concentration of Be atoms in the second area 30b (FIG. 10) is reduced more than the concentration of Be atoms in the first area 30a (FIG. 10) is reduced, due to the influence of the step of thermally diffusing the Zn atoms. Consequently, the electric field control layer 3 (FIG. 11) is formed from the semiconductor layer 30 (FIG. 10). It is inferred that the phenomenon of reduction in the concentration of the Be atoms occurs in the above-described manner because vacancies which are created below the guard ring area 7 in the optical absorption layer 4 due to the thermal diffusion of the Zn atoms suck up the Be atoms in the second area 30b of the semiconductor layer 30.

Next, the mask 50 is removed.

Again with reference to FIG. 1, the anode electrode 9 is formed in Step S80 (FIG. 7). This produces the APD 101. The cathode electrode described in Embodiment 1 may be formed at appropriate timing, though the description is omitted above. The light-receiving area 6 and the guard ring area 7 may be formed in an opposite order. In the aforementioned method, the acceptors of the light-receiving area 6 may be different from the Zn atoms.

According to Embodiment 3, the electric field control layer 3 (FIG. 10) including the high-concentration area 3H and the low-concentration area 3L can be easily formed from the semiconductor layer 30 (FIG. 8) with no concentration difference, utilizing the influence of the step of forming the guard ring area 7. Thus, the method for manufacturing the APD 101 can be simplified.

Figure 12:
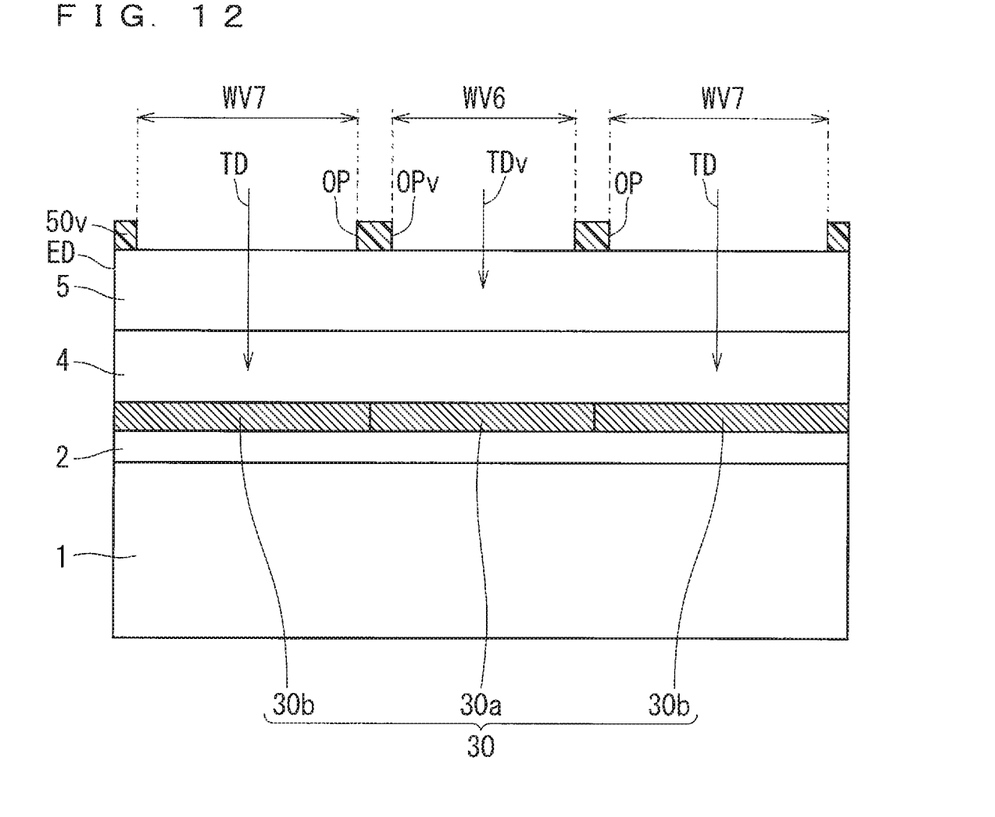
FIG. 12 is a cross-sectional view schematically illustrating one step in the method for manufacturing the semiconductor light-receiving device according to a modification of Embodiment 3 of the present invention.

FIG. 12 is a cross-sectional view schematically illustrating one step in the method for manufacturing the APD 101 according to a modification of Embodiment 3. In this modification, a mask 50v is formed after the steps illustrated in FIG. 8. The mask 50v includes an opening portion OPv in addition to the opening portion OP of the mask 50 (FIG. 11). In a cross-section illustrating the maximum dimension of the opening portion OPv (for example, FIG. 12), the opening portion OP has a width WV7 greater than a width WV6 of the opening portion OPv. Next, the Zn atoms are thermally diffused from the opening portion OPv as indicated by an arrow TDv simultaneously when the Zn atoms are thermally diffused from the opening portion OP as indicated by the arrows TD. This allows the light-receiving area 6 to be formed simultaneously with the guard ring area according to this modification. The guard ring area 7 has the width W7 greater than the width W6 of the light-receiving area 6 in the formed APD 101 (FIG. 1).

Adding a step of forming the trench TR (FIG. 6) to the manufacturing method according to Embodiment 3 and its modification can produce the APD 102 (FIG. 6: Embodiment 2).

Within the scope of the present invention, Embodiments can be freely combined, and each of Embodiments can be appropriately modified or omitted. Although this invention has been described in detail, the description is in all aspects illustrative and does not restrict the invention. It is therefore understood that numerous modifications and variations can be devised without departing from the scope of the invention.

EXPLANATION OF REFERENCE SIGNS

ED outer edge, RA light receiver, RB outer periphery, OP, OPv opening portion, SP distance, TR trench, 1 semiconductor substrate, 2 multiplication layer, 3 electric field control layer, 3H high-concentration area, 3L low-concentration area, 4 optical absorption layer, 5 window layer, 6 light-receiving area, 7 guard ring area, 9, 9v anode electrode, 10 mesa area, 30 semiconductor layer, 30a first area, 30b second area, 50, 50v mask, 101, 101v, 102 APD (semiconductor light-receiving device).

The invention claimed is:

1. A semiconductor light-receiving device, comprising:
a semiconductor substrate of n-type;
a multiplication layer formed on the semiconductor substrate and containing Al atoms;
an electric field control layer of p-type that is formed on the multiplication layer and includes a high-concentration area higher in impurity concentration than the multiplication layer, and a low-concentration area lower in impurity concentration than the high-concentration area, the low-concentration area being formed outside the high-concentration area;
an optical absorption layer formed on the electric field control layer, the optical absorption layer being lower in impurity concentration than the high-concentration area of the electric field control layer;
a window layer of n-type formed on the optical absorption layer, the window layer being larger in band gap than the optical absorption layer and including an outer edge;
a light-receiving area of p-type formed on the window layer apart from the outer edge of the window layer, the light-receiving area at least partly facing the high-concentration area of the electric field control layer through the window layer and the optical absorption layer in a thickness direction; and
a guard ring area of p-type which the window layer separates from the light-receiving area, the guard ring area penetrating through the window layer to extend into the optical absorption layer.

2. The semiconductor light-receiving device according to claim 1,
wherein a mesa area including the multiplication layer, the electric field control layer, the optical absorption layer, the light-receiving area, and the guard ring area is formed on the semiconductor substrate.

3. The semiconductor light-receiving device according to claim 1,
wherein the guard ring area contains Zn atoms, and the electric field control layer contains Be atoms.

4. The semiconductor light-receiving device according to claim 1,
wherein the guard ring area is distant from the light-receiving area by 3 µm or longer.

5. The semiconductor light-receiving device according to claim 1,
wherein the guard ring area has a carrier concentration of $1 \times 10^{18}$ cm$^{-3}$ or more.

6. The semiconductor light-receiving device according to claim 1,
wherein in a cross-section illustrating a maximum dimension of the light-receiving area, the guard ring area has a width greater than a width of the light-receiving area.

7. A method for manufacturing a semiconductor light-receiving device, the semiconductor light-receiving device including:
a semiconductor substrate of n-type;
a multiplication layer formed on the semiconductor substrate, the multiplication layer being lower in impurity concentration than the semiconductor substrate and containing Al atoms;
an electric field control layer of p-type that is formed on the multiplication layer and includes a high-concentration area higher in impurity concentration than the multiplication layer, and a low-concentration area lower in impurity concentration than the high-concentration area, the low-concentration area being formed outside the high-concentration area;
an optical absorption layer formed on the electric field control layer, the optical absorption layer being lower in impurity concentration than the high-concentration area of the electric field control layer;
a window layer of n-type formed on the optical absorption layer, the window layer being larger in band gap than the optical absorption layer and including an outer edge;
a light-receiving area of p-type formed on the window layer apart from the outer edge of the window layer, the light-receiving area at least partly facing the high-concentration area of the electric field control layer through the window layer and the optical absorption layer in a thickness direction; and
a guard ring area of p-type which the window layer separates from the light-receiving area, the guard ring area penetrating through the window layer to extend into the optical absorption layer,
the method comprising the steps of:
forming a semiconductor layer of p-type with Be atoms contained, the semiconductor layer including a first area corresponding to the high-concentration area of the electric field control layer, and a second area to be the low-concentration area of the electric field control layer;
forming the optical absorption layer on the semiconductor layer;
forming the window layer on the optical absorption layer;
forming, on the window layer, a mask with an opening portion; and
diffusing Zn atoms from the opening portion of the mask, wherein in the step of diffusing the Zn atoms, the guard ring area of p-type is formed with the Zn atoms contained, and the electric field control layer is formed from the semiconductor layer by reducing a concentration of Be atoms in the second area of the semiconductor layer more than reducing a concentration of Be atoms in the first area of the semiconductor layer.

* * * * *